United States Patent [19]

Suzuki

[11] Patent Number: 4,831,661
[45] Date of Patent: May 16, 1989

[54] RF TUNING CIRCUIT

[75] Inventor: Yukio Suzuki, Tsurugashima, Japan

[73] Assignee: Toko Kabushiki Kaisha, Tokyo, Japan

[21] Appl. No.: 103,664

[22] Filed: Oct. 2, 1987

[30] Foreign Application Priority Data

Oct. 9, 1986 [JP] Japan ................... 61-240902
Dec. 24, 1986 [JP] Japan ................... 61-314573

[51] Int. Cl.⁴ .............................................. H04B 1/10
[52] U.S. Cl. ................................. 455/302; 334/59; 336/182
[58] Field of Search .............. 455/217, 274, 269, 302, 455/304, 305, 150, 191, 200; 334/38, 63, 78, 59; 336/182; 333/177, 779

[56] References Cited

U.S. PATENT DOCUMENTS

| | | | |
|---|---|---|---|
| 2,044,745 | 6/1936 | Hansell | 455/302 |
| 2,077,069 | 2/1935 | Rechnitzer | 455/302 |
| 2,281,661 | 1/1941 | Barton | 455/302 |
| 2,761,062 | 8/1956 | Wirkler | 455/304 |
| 3,593,154 | 7/1971 | Blass et al. | 455/302 |
| 4,228,546 | 10/1980 | Ogita | 455/302 |
| 4,342,999 | 8/1982 | Woodward | 455/274 |
| 4,361,819 | 11/1982 | Sillard et al. | 455/217 |
| 4,491,843 | 1/1985 | Boubouleix | 455/269 |

Primary Examiner—Robert L. Griffin
Assistant Examiner—Curtis Kuntz
Attorney, Agent, or Firm—Stevens, Davis, Miller & Mosher

[57] ABSTRACT

A RF tuning circuit according to this invention is composed of one tuned transformer ($T_1$) at least and an untuned transformer ($T_2$) so interconnected that the outputs from the respective transformers add up opposite in phase on that side of the resonant frequency of the tuned transformer where the image signal frequency is present and in phase on that side thereof where the image signal is absent and that the output amplitude levels of the respective transformers become equal at the image signal frequency corresponding to a particular receiving frequency as the resonant frequency is varied in response to the receiving frequency.

9 Claims, 5 Drawing Sheets

RF TUNING CIRCUIT

DETAILED DESCRIPTION OF THE INVENTION

1. Technical Field

The present invention relates to RF tuning circuits particularly useful for suppressing the image signal in the superheterodyne receivers.

2. Background Art

In order to suppress the image signal in the superheterodyne receivers, there have been used several methods, such as increasing the number of tuned r-f filter stages, provision of the antiresonance point for the tuning coil, and provision of a separate trap circuit for the image signal. None of these methods, however, have been found perfectly satisfactory. Increasing the number of tuned r-f filter stages inevitably increases the numbers of coils for tuned r-f filters, variable capacitors, and variable capacitance diodes, imposing added cost and complexity of circuit adjustments due to an increase in the number of tuned r-f filter stages. Where the tuned filter is composed of a parallel resonant circuit, with antiresonance provided for the coil, adjustment of the tap position or the coupling coefficient of the coil becomes difficult and freedom of the circuit design is sacrificed.

Since the frequency positional relationship between the antiresonance and resonance points is fixed, displacement of the image signal frequency with varying receiving frequency will considerably offset the suppression effect, although the image signal corresponding to a particular receiving frequency may be suppressed.

At frequencies beyond the antiresonance point, the attenuation amount of the signal will rapidly diminish, as if a "bouncing back" phenomenon took place. This will rather worsen the image signal suppression effect in most cases.

Provision of the trap circuit is not almighty—i.e., it can only suppress the image signal of a particular frequency.

This is to say that there has not been a perfect method with a simple circuit for uniformly suppressing the image signal whose frequency varies with the receiving frequency.

SUMMARY OF THE INVENTION

Object

An object of the present invention is to provide a simple RF tuning circuit capable of suppressing the image signal almost uniformly over a wide receiving frequency band.

Technical Means

Outstanding features of a RF tuning circuit for use in the superheterodyne receivers according to this invention may be summed up as follows:

The RF tuning circuit is composed of a tuned transformer forming a series-tuned circuit with a variable capacitance element connected to either the primary or the secondary of the tuned transformer and an untuned transformer having a winding connected in shunt with said series-tuned circuit of the tuned transformer and the other connected in series with that winding of said tuned transformer to which the variable capacitance element is unconnected.

These transformers using one side as the input and the other as the output are so interconnected that the outputs of the tuned and untuned transformers are connected to be out of phase, or 180° out of phase with each other, on that side of the resonant frequency of the tuned transformer where the image signal frequency for the receiving frequency is present and in phase on that side where the image signal frequency is absent.

Furthermore, the output amplitude levels of the respective transformers have been adjusted in advance so as to be approximately equal at the image signal frequency corresponding to a particular receiving frequency.

The image signal frequency corresponding to a particular receiving frequency is selected to minimize a frequency difference between the image signal frequency and the frequency at which the output amplitude levels of the tuned transformer and the untuned transformer are equal over the entire receiving band.

To be more specific, the higher the receiving frequency within the receiving band, the less will be the frequency difference between the receiving frequency and the image signal frequency to make the image signal suppression more difficult.

It is therefore desirable that a particular receiving frequency be selected at a comparatively high frequency within the receiving band for the purpose of the image signal suppression over the entire receiving band.

BRIEF DESCRIPTION OF THE DRAWINGS;

The invention will be described by referring to the accompanying drawings wherein.

Preferred Embodiments

Figure 1:
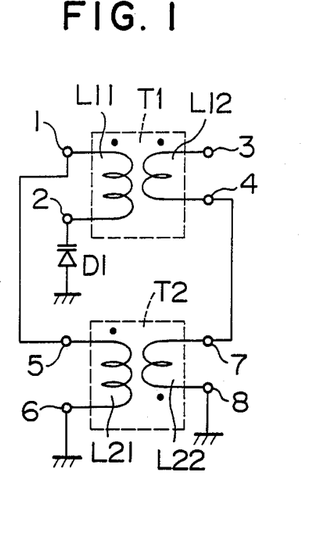
FIG. 1 is a circuit diagram for an embodiment of the RF tuning circuit constructed in accordance with the present invention.

The invention will now be described by referring to the circuit diagram of FIG. 1 illustrating a basic embodiment of the RF tuning circuit according to this invention and to its characteristic diagrams, FIGS. 2 through 4.

Referring to FIG. 1, $T_1$ denotes a tuned transformer and $T_2$ denotes an untuned transformer.

The tuned transformer $T_1$ consists of an input primary winding $L_{11}$ and an output secondary winding $L_{12}$, with the opposite ends of the primary winding $L_{11}$ and the opposite ends of the secondary winding $L_{12}$ being connected to terminals 1 and 2 and terminals 3 and 4, respectively.

A side of the primary $L_{11}$ connected to terminal 1 and a side of the secondary connected to terminal 3 are of the same polarity.

A variable capacitance diode $D_1$ is connected between terminal 2 and grounded so that a series-tuned circuit consisting of the primary $L_{11}$ and the variable capacitance diode $D_1$ is formed. An input signal applied to terminal 1 serving also as the "hot" side input terminal of the RF tuning circuit is tuned to resonance in this series-tuned circuit.

The untuned transformer $T_2$ consists of two windings, i.e., a; primary $L_{21}$ and a secondary $L_{22}$. The opposite ends of the primary $L_{21}$ and the opposite ends of the secondary $L_{22}$ are respectively connected to terminals 5 and 6 and terminals 7 and 8.

The primary $L_{21}$ connected to terminal 5 and the secondary $L_{22}$ connected to terminal 8 are of the same polarity. Both terminals 6 and 8 are grounded, while terminals 5 and 7 are respectively connected to terminals 1 and 4 on the tuned transformer $T_1$.

In such a way, the primary $L_{21}$ of the untuned transformer $T_2$ is connected in shunt with the series-tuned circuit consisting of the primary $L_{11}$ of the tuned transformer $T_1$ and the variable capacitance diode $D_1$, while the secondary $L_{22}$ is connected in series with the secondary $L_{12}$ of the tuned transformer $T_1$. Terminal 3 also serves as the "hot" side output terminal of the RF tuning circuit.

Figure 2:
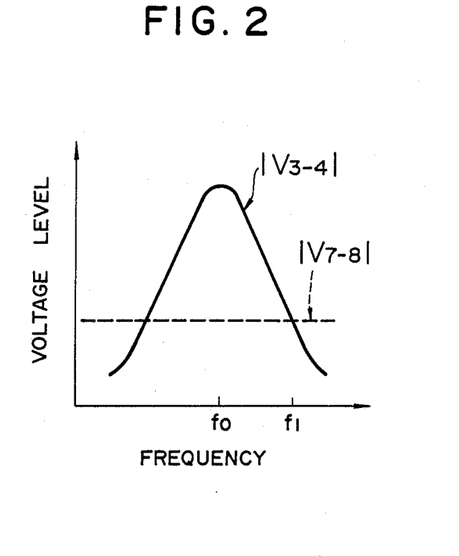
FIG. 2 is the output voltage characteristics of the tuned and the untuned transformer shown in FIG. 1 when they are not interconnected.

FIG. 2 illustrates an output voltage characteristic of each transformer in cases where the tuned and untuned transformers $T_1$ and $T_2$ shown in FIG. 1 are not mutually connected, wherein the abscissa and the ordinate denote respectively frequency and voltage level.

In FIG. 2 $|V_{3-4}|$ denotes the amplitude of the output voltage $V_{3-4}$ available between output terminals 3 and 4 on the tuned transformer $T_1$ with varying input signal frequency. The voltage level reaches a maximum at the resonant frequency $f_0$.

In FIG. 2 again $|V_{7-8}|$ shown dotted denotes the amplitude of the output voltage $V_{7-8}$ available between output terminals 7 and 8 on the untuned transformer $T_2$. The voltage level is independent of the frequency and remains flat despite the change in frequency of the input signal applied between input terminals 5 and 6.

In the output voltage characteristic curve in FIG. 2, $f_1$ at which the amplitude $|V_{3-4}|$ of the output voltage $V_{3-4}$ and the amplitude $|V_{7-8}|$ of the output voltage $V_{7-8}$ become equal is higher than the resonant frequency $f_0$.

This frequency $f_1$ conforms to the image signal frequency corresponding to a particular receiving frequency as will later be mentioned.

Figure 3:
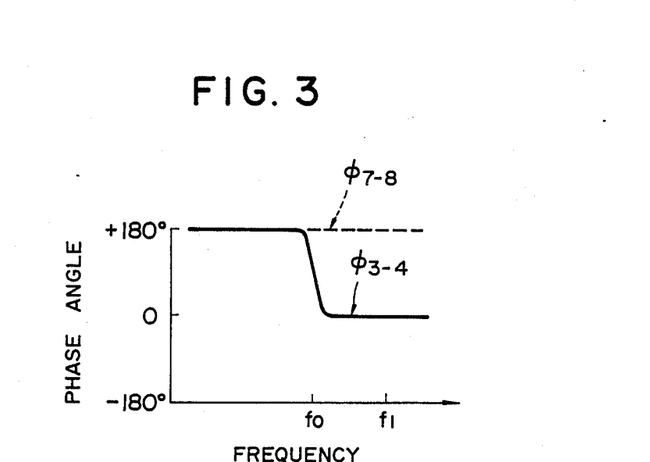
FIG. 3 is a diagram illustrating the phase relationship of the output voltages of the tuned and untuned transformer shown in FIG. 1 when they are not interconnected.

FIG. 3 illustrates the phase angle characteristics of the output voltages of the two transformers with respect to the input signals when they are not mutually connected.

In FIG. 3, $\Phi_{3-4}$ denotes the phase angle of the output voltage $V_{3-4}$ and available between terminals 3 and 4 with respect to the input signal. As shown, it varies rapidly in the vicinity of the resonant frequency $f_0$. The output voltage advances in phase almost 180° on the lower frequency side of the resonant frequency $f_0$, but it is in phase with the input signal on the higher frequency side of the resonant frequency $f_0$.

On the other hand, $\Phi_{7-8}$ shown dotted denotes the phase angle of the output voltage $V_{7-8}$ available between output terminals 7 and 8 with respect to an input signal applied between terminals 5 and 6.

In other words, the output voltage leads the input signal by 180° at all times and remains unchanged with frequency.

Such output voltage phase relationship is obtained by determining the polarities of the primary and the secondary of each transformer as illustrated in FIG. 1.

Figure 4:
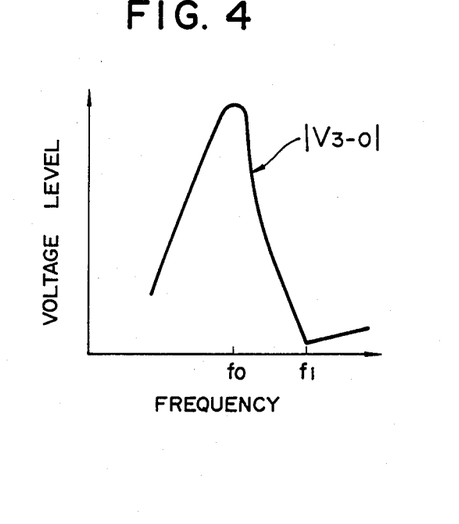
FIG. 4 illustrates the output voltage characteristic of the RF tuning circuit of FIG. 1.

An output voltage characteristic as shown in FIG. 4 is obtained between terminal 3 which serves the function of an output terminal on the RF tuning circuit and ground by interconnecting the tuned transformer $T_1$ and the untuned transformer $T_2$ having the output voltage characteristics as illustrated in FIGS. 2 and 3 in a manner as shown in FIG. 1.

The amplitude $|V_{3-0}|$ of the output voltage $V_{3-0}$ obtained between terminal 3 and grounded is the vector sum of the output voltages $V_{3-4}$ and $V_{7-8}$ that differ in the amplitude and phase relations with each other.

Accordingly, the voltage amplitude level $|V_{3-0}|$ falls off more steeply than the output voltage $V_{3-4}$ from $f_0$ to $f_1$ to reach a minimum frequency $f_1$ and then, it increases gradually thereafter.

As will be evident from the descriptions in connection with FIGS. 2 and 3, this is due to the fact that at frequencies higher than the resonant frequency $f_0$, the output voltage $V_{3-4}$ of the tuned transformer $T_1$ and the output voltage $V_{7-8}$ of the untuned transformer $T_2$ are 180° out of phase with each other so that the amplitudes of both voltages are substantially subtracted from each other.

The voltage level reaches a minimum at $f_1$ at which the amplitudes of the output voltages $V_{3-4}$ and $V_{7-8}$ become equal.

Since the amplitude $|V_{7-8}|$ becomes greater than the amplitude $|V_{3-4}|$ as the frequency $f_1$ is exceeded, the voltage level of amplitude $|V_{3-0}|$ increases gradually.

But, since the falling-off state of amplitude $|V_{3-4}|$ tends to saturate, the difference between $|V_{3-4}|$ and $|V_{7-8}|$ will not increase so much, there being no possibility for a rapid increase as in cases where the conventional anti-resonance point is exceeded.

The amplitudes of the output voltages $V_{3-4}$ and $V_{7-8}$ become equal under out of phase state in the RF tuning circuit whose output voltage characteristic is shown in FIG. 4.

Its image signal suppression effect is fully displayed by making the frequency $f_1$ at which the voltage level of amplitude $|V_{3-0}|$ of the output voltage $V_{3-0}$ becomes the lowest coincident with the image signal frequency corresponding to a particular receiving frequency. Needless to say, the receiving frequency corresponds to the resonant frequency $f_0$.

In case of the upper heterodyne system, as has been publicly known, the image signal frequency is located high than the receiving frequency by twice the intermediate frequency.

It is therefore easy to set up the relations between the resonant frequency $f_0$ and frequency $f_1$ which is coincident with the image signal frequency. Since the image signal frequency shifts with varying receiving frequency, there occurs a certain deviation between frequency $f_1$ and the image signal frequency.

But, the frequency $f_1$ at the intersection of amplitudes $|V_{3-4}|$ and $|V_{7-8}|$ will also shift with change in the resonsont frequency $f_0$ as will be evident from FIG. 2. Therefore, there is no apprehension for an amount of the deviation.

Accordingly, by selecting a particular receiving frequency and making $f_1$ coincident with its image frequency so as to minimize the deviation over the entire receiving band, the image signal can be suppressed over the entire receiving band, having $f_1$ follow up the image frequency in spite of change in the resonant frequency $f_0$.

Incidentally, the polarities and the turn ratios of the primary $L_{21}$ and the secondary $L_{22}$ of the untuned transformer $T_2$ are determined in order to set up the frequency $f_1$. But, the input inductance value suffices to be on the order that the input circuit of the overall RF tuning circuit is prevented from being overloaded. The inductance may be of the order of from several tens of microhenries to several millihenries, provided the receiving band is the middle wave band.

Further, the unloaded Q may be of the order of from 10 to 20.

The untuned transformer $T_2$ may have resonance at a frequency sufficiently lower or higher than the frequency band in which the receiving frequency and the image signal frequency exist, provided phase and amplitude remain constant within the frequency band.

Figure 9:
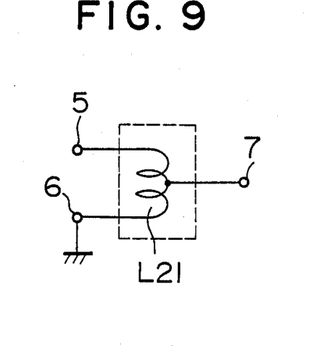
FIG. 9 is a connection diagram illustrating a circuit structure of an untuned transformer different from the one shown in FIG. 1.

Although the primary $L_{21}$ and the secondary $L_{22}$ are mutually insulated, the output secondary may be formed by providing a tap on the primary $L_{21}$ as illustrated in FIG. 9. In this case, the polarities of either the primary $L_{11}$ or the secondary $L_{12}$ of the tuned transformer $T_1$ should be reversed in order to maintain the same phase relationship.

In case of the lower heterodyne system, the image signal frequency is located lower than the receiving frequency by twice the intermediate frequency. In this case, phase angles $\Phi_{3-4}$ and $\Phi_{7-8}$ should be made 180° out of phase with each other on the lower frequency side of the resonant frequency $f_0$ and in phase on the higher frequency side of the resonant frequency $f_0$.

Furthermore, referring to FIG. 1, the input and output terminal potentials may be reversed to that of the embodiment by adapting terminal 6 as the hot input side and terminal 8 as grounded side and further, terminal 8 as the "hot" output side and terminal 3 as ground side. In this case, polarities of the tuned transformer $T_1$ and the untuned transformer $T_2$ must be adjusted so at to make the output phase relationship becomes the same as the embodiment.

Figure 5:
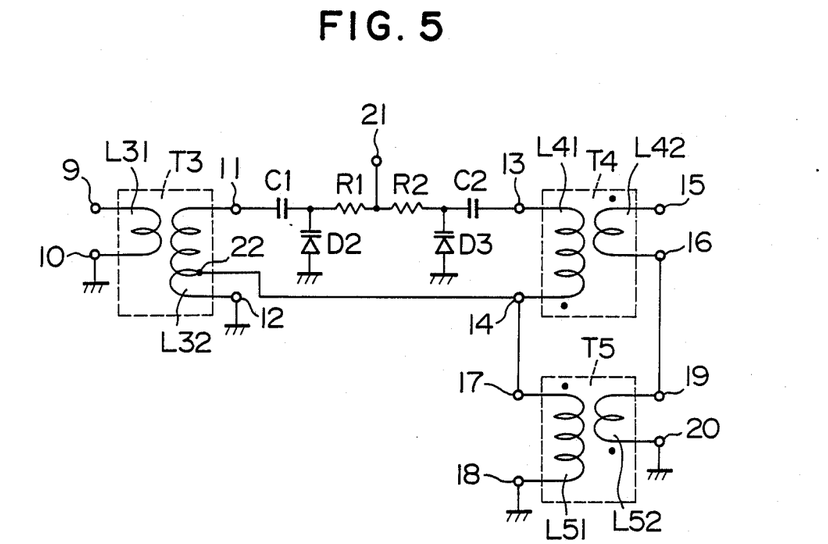
FIG. 5 is a circuit diagram for another embodiment of the RF tuning circuit according to this invention.

FIG. 5 is a circuit diagram illustrating another embodiment of the RF tuning circuit according to this invention as applied to a vehicle-mounted middle wave hand receiver.

This RF tuning circuit is a double-tuned type, composed of two tuned transformers $T_3$ and $T_4$ and one untuned transformer $T_5$.

The opposite ends of the primary $L_{31}$ of the tuned transformer $T_3$ are connected to terminals 9 and 10 and the opposite ends of the secondary $L_{31}$ of $T_3$ are connected to terminals 11 and 12, respectively.

The polarities of the primary and secondary windings $L_{31}$ and $L_{32}$ may be arbitrarily chosen. Terminals 10 and 12 are grounded and terminal 9 serves as the "hot" side input terminal of the RF tuning circuit.

Terminal 11 is connected via capacitor $C_1$, resistor $R_1$, resistor $R_2$, and capacitor $C_2$ to terminal 13 on the tuned transformer $T_4$. Variable capacitance diode $D_2$ is connected between the junction of capacitor $C_1$ and resistor $R_1$ and ground. Similarly, variable capacitance diode $D_3$ is connected between the junction of resistor $R_2$ and capacitor $C_2$ and ground. Terminal 21 to supply a bias voltage is connected to the junction of resistor $R_1$ and resistor $R_2$.

The opposite ends of the primary $L_{41}$ of the tuned transformer $T_4$ are connected to terminals 13 and 14 and the opposite ends of the secondary $L_{42}$ are connected to terminals 15 and 16, respectively.

Terminal 14 is connected to tap 22 on the secondary $L_{32}$ of the tuned transformer $T_3$. Terminal 15 serves as the "hot" side output terminal of the RF tuning circuit. A side of the primary $L_{41}$ connected to terminal 14 and a side of the secondary $L_{42}$ connected to terminal 15 are of the same polarity.

The opposite ends of the primary $L_{51}$ of the untuned transformer $T_5$ are connected to terminals 17 and 18, and the opposite ends of the secondary $L_{52}$ are connected to terminals 19 and 20, respectively.

A side of the primary $L_{51}$ connected to terminal 17 and a side of the secondary $L_{52}$ connected to terminal 20 are of the same polarity.

Terminals 17 and 19 are respectively connected to terminals 14 and 16 on the tuned transformer $T_4$, while both terminals 18 and 20 are grounded.

$R_1$ and $R_2$ are bias resistors and $C_1$ and $C_2$ are capacitors to block the flow of direct current.

In the RF tuning circuit of FIG. 5, a parallel-tuned circuit is formed with the secondary $L_{32}$ of the tuned transformer $T_3$, and the variable capacitance diode $D_2$ and further, a series-tuned circuit is formed with the primary $L_{41}$ of the tuned transformer $T_4$ and the variable capacitance diode $D_3$.

Whereas the primary $L_{51}$ of the untuned transformer $T_5$ is connected in shunt with the series-tuned circuit of the tuned transformer $T_4$, the secondary $L_{52}$ is connected in series with the secondary $L_{42}$ of the tuned transformer $T_4$. Although an input signal incoming from terminal 9 is fed through the double-tuned circuit, the image signal can be suppressed in the same way as with the embodiment of FIG. 1, provided the tuned and untuned transformers $T_4$ and $T_5$ are interconnected as mentioned previously.

With the embodiment of FIG. 5, the output voltage characteristic obtained between terminal 15 serving as the output terminal of the RF tuning circuit and ground is so determined that the image signal frequency of 2,300 KHz can be suppressed most prominently when the intermediate frequency is 450 KHz and the resonant frequency has a comparatively high value of 1,400 KHz.

This is to say that referring to the output voltage characteristics of both tuned and untuned transformers $T_4$ and $T_5$, the output voltage amplitude levels are made equal at the image signal frequency of 2,300 KHz which corresponds to one of the reception frequencies of 1,400 KHz. The 2,300 KHz frequency corresponds to $f_1$ for the embodiment of FIG. 1.

The optimum turn ratios to be selected for the primary $L_{41}$ to the secondary $L_{42}$ of the tuned transformer $T_4$ and for the primary $L_{51}$ to the secondary $L_{52}$ of the untuned transformer $T_5$ will be of the order of 6:1 and 5:1, respectively.

Figure 6:
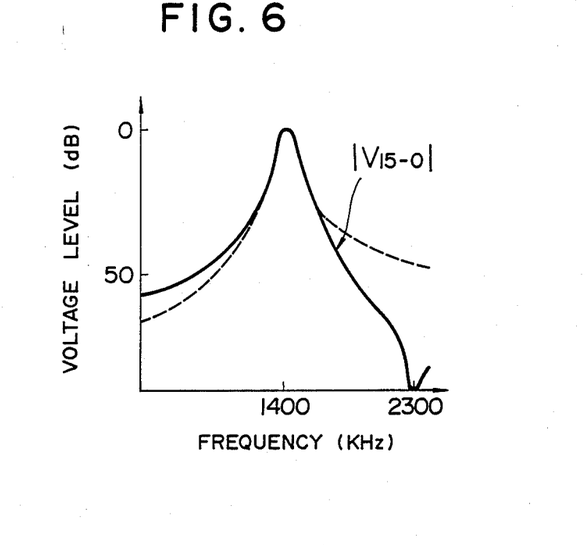
FIGS. 6, 7 and 8 illustrate the output voltage characteristics of the RF tuning circuit shown in FIG. 5.
Figure 7:
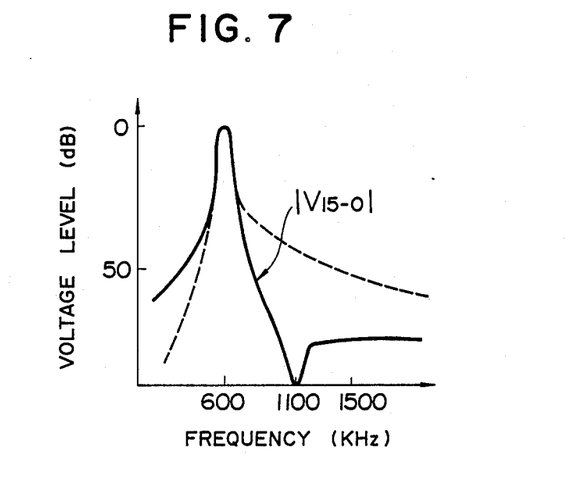
Figure 8:
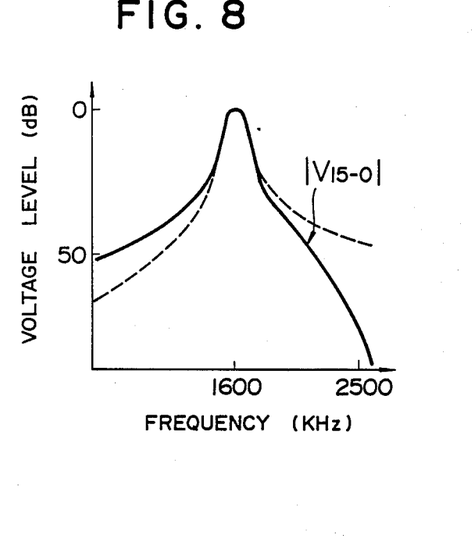

FIGS. 6, 7 and 8 illustrate the output voltage characteristics of the RF tuning circuit of FIG. 5. The ordinate denotes the level of the amplitude $|V_{15-0}|$ of the output voltage $V_{15-0}$ available between terminal 15 and ground as expressed in terms of the attenuation amount. The resonant frequencies are respectively taken as 1,400 KHz, 600 KHz, and 1,600 KHz. Any one of the dotted curves represents the amplitude of the output voltage, with the untuned transformer $T_5$ being unconnected according to the conventional practice. In the absence of the untuned transformer $T_5$, terminal 16 must be grounded.

Referring to FIG. 6, it is seen that the frequency corresponding to $f_1$ for the embodiment of FIG. 1 is taken as 2,300 KHz. That is, the frequency for the greatest attenuation amount coincides with the image signal frequency, resulting in the perfect image signal suppression.

Referring to FIG. 7, it is seen that the image signal frequency of 1,500 KHz shifts towards the higher frequency side of 1,100 KHz in the vicinity of which the greatest attenuation occurs. But, an attenuation amount in excess of 20 dB occurs as compared with the dotted curve.

Referring to FIG. 8, it is seen that the image signal frequency of 2,500 KHz shifts towards the lower frequency side of the frequency at which maximum attenuation occurs. But, an attenuation amount in excess of 30 dB occurs as compared with the dotted curve.

As will be evident from the embodiment as applied to the middle wave band, it is desirable that the output voltage characteristics of the RF tuning circuit of the upper-sideband heterodyne system be designed such that on the relatively higher frequency side of the receiving band, the image signal frequency exists on the lower frequency side of the frequency at which the attenuation is maximum, and on the relatively lower frequency side of the receiving band, it exists on the higher frequency side of that frequency at which the attenuation is maximum.

To fulfill these requirements, an image signal frequency corresponding to a particular receiving frequency is selected as 2,300 KHz. Thus, an attenuation of the image signal which moves with the varying receiving frequency in the middle wave band can be greatly improved from 20 dB to 40 dB as compared with the conventional practice.

Incidentally, depending on the relation with peripheral circuits, an equally desirable result could be obtained by selecting one image signal frequency point within the range extending from the image signal frequency of 1,900 KHz for the 1,000 KHz receiving frequency to the order of the image signal frequency according to the embodiment of this invention.

Figure 10:
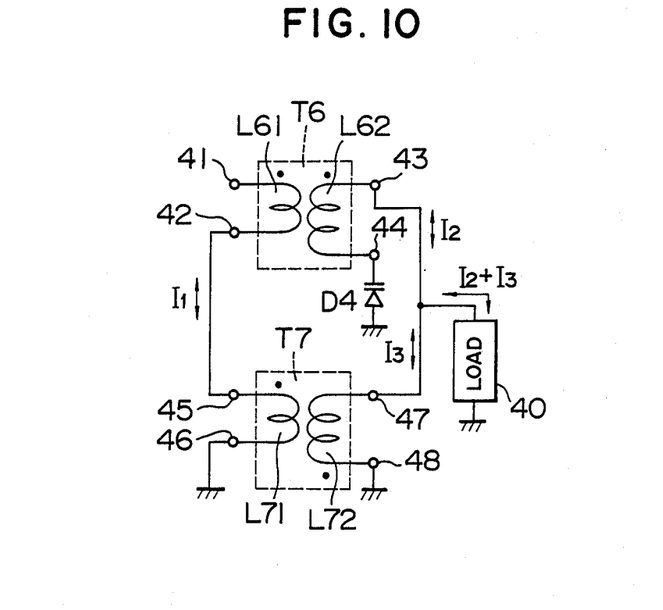
FIG. 10 is a circuit diagram for still another embodiment of the RF tuning circuit according to this invention.

FIG. 10 is a circuit diagram for still another embodiment of the RF tuning circuit according to this invention. It is seen that this circuit structure could be realized by substantially reversing the input and output sides of the embodiment of FIG. 1.

Referring to FIG. 10, $T_6$ and $T_7$ denote respectively a tuned transformer and an untuned transformer. The tuned transformer $T_6$ consists of the primary $L_{61}$ and the secondary $L_{62}$. The opposite ends of the primary $L_{61}$ and the opposite ends of the secondary $L_{62}$ are respectively connected to terminals 41 and 42 and terminals 43 and 44. A side of the primary $L_{61}$ connected to terminal 41 and a side of the secondary connected to terminal 43 are of the same polarity.

A variable capacitance diode $D_4$ is connected between terminal 44 and ground, with a series-tuned circuit consisting of the secondary $L_{62}$ and the variable capacitance diode $D_4$ being formed as illustrated.

An input signal applied to terminal 41 serving also as the "hot" side input terminal of the RF tuning circuit is tuned in this series-tuned circuit.

The untuned transformer $T_7$ consists of a primary $L_{71}$ and a secondary $L_{72}$. The opposite ends of the primary $L_{71}$ are connected to terminals 45 and 46, while the opposite ends of the secondary $L_{72}$ are connected to terminals 47 and 48, respectively.

A side of the primary $L_{71}$ connected to terminal 45 and a side of the secondary $L_{72}$ connected to terminals 48 are of the same polarity. Both terminals 46 and 48 are grounded and terminals 45 and 47 are respectively connected to terminals 42 and 43 on the tuned transformer $T_6$.

In such a manner, the primary $L_{71}$ of the untuned transformer $T_7$ is connected in series with the primary $L_{61}$ of the tuned transformer $T_6$, while the secondary $L_{72}$ is connected in shunt with the series-tuned circuit consisting of the secondary $L_{62}$ of the tuned transformer $T_6$ and the variable capacitance diode $D_4$.

Terminals 43 and 47 are connected to a load 40 connected in common to the tuned transformer $T_6$ and the untuned transformer $T_7$, with an output voltage being obtained from the load 40. It will be understood that the load 40 corresponds to the circuit part of an r-f amplifier or a frequency mixer. $I_2$ and $I_3$ denote output currents fed to the load 40 from the tuned transformer $T_6$ and the untuned transformer $T_7$, respectively.

Figure 12:
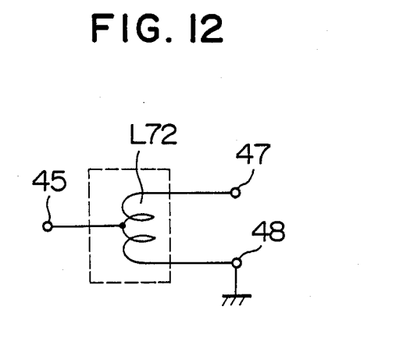
FIG. 12 is a connection diagram illustrating a circuit structure of an untuned transformer different from the one shown in FIG. 10.

Incidentally, although the primary $L_{71}$ and the secondary $L_{72}$ are mutually insulated in the circuit diagram of FIG. 10, the input side primary may be formed by providing a tap on the secondary $L_{72}$ as illustrated in FIG. 12. In this case, need arises to obtain the same phase relationship as the embodiment by reversing the polarities of either the primary $L_{61}$ or the secondary $L_{62}$ of the tuned transformer $T_6$.

With such a circuit structure as shown in FIG. 10, the amplitude $|I_2|$ of the output current $I_2$ from the tuned transformer $T_6$ and the amplitude $|I_3|$ of the output current $I_3$ from the untuned transformer $T_7$ correspond respectively to the amplitude $|V_{3-4}|$ of the output voltage $V_{3-4}$ from the tuned transformer $T_1$ and the amplitude $|V_{7-8}|$ of the output embodiment of FIG. 1. Furthermore, the phase angle $\Phi_2$ of the output current $I_2$ relative to the input current $I_1$ and the phase angle $\Phi_3$ of the output current $I_3$ relative to the input current $I_1$ correspond respectively to the phase angle $\Phi_{3-4}$ of the output voltage $V_{3-4}$ and the phase angle $\Phi_{7-8}$ of the output voltage $V_{7-8}$.

The amplitude $|I_2|$ reaches a maximum at the resonant frequency $f_0$ as the input signal frequency varies. The amplitude $|I_3|$ is independent of frequency. The frequency at which the amplitudes $|I_2|$ and $|I_3|$ become equal corresponds to the frequency $f_1$ for the embodiment of FIG. 1.

The amplitude $|I_2+I_3|$ of the output current $(I_2+I_3)$ fed to the load 40 corresponds to the amplitude $|V_{3-0}|$ of the output voltage $V_{3-0}$. Thus the image suppression effect can be displayed in the same way as the embodiment of FIG. 1 at the frequency $f_1$ which is coincident with a particular image signal frequency.

Figure 11:
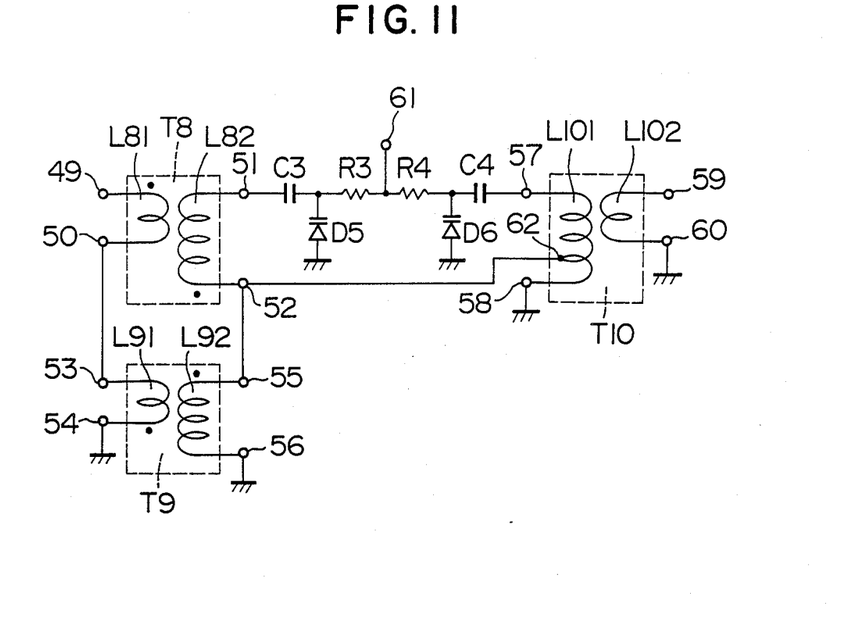
FIG. 11 is a circuit diagram for a further embodiment of the RF tuning circuit according to this invention.

FIG. 11 is a circuit diagram for a further embodiment of the RF tuning circuit according to this invention. It is seen that this circuit structure is allied to one in which the input and output sides of the embodiment of FIG. 5 are reversed.

This tuned r-f circuit is a double tuned type, being composed of two tuned transformers $T_8$ and $T_{10}$ and one untuned transformer $T_9$.

The opposite ends of the primary $L_{81}$ of the tuned transformer $T_8$ are connected to terminals 49 and 50, while the opposite ends of the secondary $L_{82}$ are connected to terminals 51 and 52, respectively.

Terminal 52 is connected to a tap 62 on the primary $L_{101}$ of the tuned transformer $T_{10}$, while terminal 49 serves the function of the "hot" side input terminal on the tuned r-f circuit. A side of the primary $L_{81}$ connected to terminal 49 and a side of the secondary $L_{82}$ connected to terminal 52 are of the same polarity.

The opposite ends of the primary $L_{91}$ of the untuned transformer $T_9$ are connected to terminals 53 and 54, while the opposite ends of the secondary $L_{92}$ are connected to terminals 55 and 56, respectively. A side of the primary $L_{91}$ connected to terminal 54 and a side of the secondary $L_{92}$ connected to terminal 55 are of the same polarity. Terminals 53 and 55 are respectively connected to terminals 50 and 52 on the tuned transformer $T_8$, while both terminals 54 and 56 are grounded.

The opposite ends of the primary $L_{101}$ of the tuned transformer $T_{10}$ are connected to terminals 57 and 58, while the opposite ends of the secondary $L_{102}$ are connected to terminals 59 and 60, respectively. The polarities of both the primary $L_{101}$ and the secondary $L_{102}$ may be arbitrarily chosen. Both terminals 58 and 60 are grounded, while terminal 59 serves the function of the "hot" side output terminal on the RF tuning circuit.

Terminal 57 is connected via capacitor $C_4$, resistor $R_4$, resistor $R_3$, and capacitor $C_3$ to terminal 51 on the tuned transformer $T_8$.

A variable capacitance diode $D_5$ is connected between the junction of the capacitor $C_3$ and the resistor $R_3$ and ground. Similarly, a variable capacitance diode $D_5$ is connected between the junction of the resistor $R_4$ and the capacitor $C_4$ and ground. The junction of the resistors $R_3$ and $R_4$ is connected to terminal 61 for supplying a bias voltage. Resistors $R_3$ and $R_4$ are the bias resistors, while capacitors $C_3$ and $C_4$ are to block the flow of direct current.

Referring to the RF tuning circuit of FIG. 11, it is seen that a parallel-tuned circuit is formed by the primary $L_{101}$ of the tuned transformer $T_{10}$ corresponding to the load 40 in FIG. 10 and the variable capacitance diode $D_6$ and that a series-tuned circuit is formed by the secondary $L_{82}$ of the tuned transformer $T_8$ and the variable capacitance diode $D_5$.

The secondary $L_{92}$ of the untuned transformer $T_9$ is connected in shunt with the series-tuned circuit of the tuned transformer $T_8$, while the primary $L_{91}$ is connected in series with the primary $L_{81}$ of the tuned transformer $T_8$.

While an input signal applied to terminal 49 is fed through the double tuned circuit, the image signal can be equally suppressed as mentioned previously in connection with the embodiment of FIG. 10 by interconnecting the tuned transformer $T_8$ and the untuned transformer $T_9$ as described previously.

Substantially the same output voltage characteristic as with the embodiment of FIG. 5 can be obtained between terminal 59 and ground by setting the intermediate frequency at 450 KHz and designing such that the image signal frequency of 2,300 KHz can be most prominently suppressed for the 1,400 KHz resonant frequency.

In such a way, the RF tuning circuit constructed according to this invention enables substantially the same output characteristic to be obtained, even if the input side and the output side are reversed, so to speak.

Figure 13:
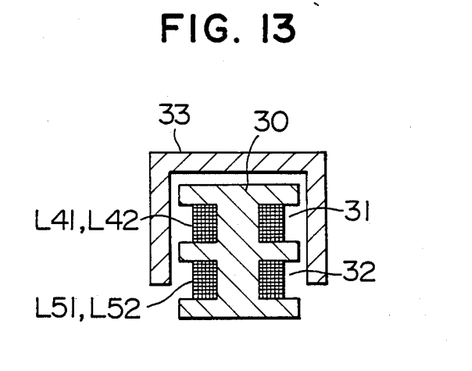
FIG. 13 is a cross-sectional view of a core assembly, with the primary and secondary windings of each of the tuned and untuned transformers being separately wound in the two slots provided in the inner core.

FIG. 13 is a cross-sectional view of a core assembly, with the windings of the mutually connected tuned and untuned transformers being wound separately in the two slots provided in the inner core. A description will be made for the case of the embodiment of FIG. 5.

Two winding slots 31 and 32 are provided in a drum-shaped inner core 30 equipped with three collars. In the winding slot 31, the primary winding $L_{41}$ and the secondary winding $L_{42}$ of the tuned transformer $T_4$ are accommodated, while in the winding slot 32, the primary winding $L_{51}$ and the secondary winding $L_{52}$ of the untuned transformer are accommodated. Thus, the windings of the tuned transformer $T_4$ and windings of the untuned transformer $T_5$ are accommodated in the two separate circular slots.

In FIG. 13, 33 denotes an outer, cup-shaped core to cover the inner core 30. By moving the outer core 33 up and down, the characteristic of the tuned transformer $T_4$ can be adjusted.

In cases where the mutually connected tuned and untuned transformer windings are wound on the same core, an untuned transformer, if newly added, will not substantially change the configuration, notably the size of the RF tuning circuit. Nor will there be need for an additional core that contributes to an extra cost. Further, the RF tuning circuit can be easily fabricated. Needless to say, the winding method for the tuned and untuned transformers as such can find application in any of the previously mentioned embodiments.

While a description has been made above of the tuned and untuned transformer windings as wound on the same inner core, a conductive pattern having the same functions as the windings may be formed on a printed circuit board using the publicly known techniques.

As has been fully described, the RF tuning circuit constructed according to the principles of this invention comprises at least one tuned transformer and one untuned transformer so interconnected that the outputs of the respective transformers are connected to be out of phase on that side of the resonant frequency of the tuned transformer where the image signal frequency is present, and in phase on that side where the image signal is absent.

As the resonant frequency is varied in response to the rceiving frequency, the output amplitude levels of the two transformers are made equal at the image signal frequency corresponding to a particular receiving frequency.

Then, in spite of the displacement of the image signal frequency together with the resonant frequency, there will occur no large deviation between the image signal frequency and the frequency $f_1$ for the embodiment of FIG. 1, for example, at which the amount of the attenuation of the output voltage level is the greatest.

In other words, the image signal in the vicinity of the frequency for the greatest attenuation amount of the output voltage level can be suppressed in a wide frequency band.

What is claimed is:

1. An RF tuning circuit for superheterodyne receivers, comprising:
   a tuned transformer having a primary as an input and a secondary as an output so as to form a series-tuned circuit with a variable capacitance element connected to one of said primary and said secondary of said tuned transformer, an untuned transformer having a first winding and a second winding, said first winding being connected in shunt with said series-tuned circuit for said tuned transformer and said second winding being connected in series with the other of the primary and the secondary of said tuned transformer to which said variable capacitance element is not connected; and interconnecting means for interconnecting said tuned transformer and said untuned transformer such that said output of said tuner transformer and an output of said untuned transformer are connected to be out of phase at frequencies on a side of a resonant frequency of said tuned tranformer at which an image signal frequency for the receiving frequency is present and in phase at frequencies on a side of said resonant frequency of said tuned transformer at which said image signal frequency is absent, whereby amplitude levels of the output signal of said tuned transformer and said output signal of said untuned transformer are adjusted to become approximately equal at an image signal frequency corresponding to a particular receiving frequency as a resonant frequency of said tuned transformer is varied in response to said receiving frequency.

2. An RF tuning circuit for the superheterodyne receivers, comprising:

a tuned transformer having a primary as an input and a secondary as an ouput to form a series-tuned circuit with a variable capacitance element connected to said primary so as to develop an RF output from said secondary;

an untuned transformer having a winding as an input and another winding as an output, said input being connected in shunt with said series-tuned circuit of said tuned transformer and said output being connected in series with said secondary of said tuned transformer, and interconnecting means for interconnecting said tuned transformer and said untuned transformer such that said output of said tuned transformer and said output of said untuned transformer are connected to be opposite in phase at frequencies on a side of a resonant frequency of said tuned transformer at which an image frequency for a receiving frequency is present and in phase at frequencies on a side thereof at which said image signal frequency is absent, whereby amplitude levels of the output of said tuned transformer and of said untuned transformer are adjusted to become approximately equal at an image signal frequency corresponding to a particular receiving frequency as a resonant frequency is varied in response to said receiving frequency.

3. An RF tuning circuit of claim 2, wherein the secondary of the untuned transformer is formed by providing a tap on the primary.

4. An RF tuning circuit for superheterodyne receivers, comprising:

a tuned transformer having a primary as an input and a secondary as an output to form a series-tuned circuit with a variable capacitance element connected to said secondary to develop an RF output from said secondary;

an untuned transformer having a winding as an input and another winding as an output, said input of said untuned transformer being connected in series with said primary of said tuned transformer and said output of said untuned transformer being connected in shunt with said series-tuned circuit; and interconnecting means for interconnecting said tuned transformer and said untuned transformer to supply current to a load connected in common to the output of said tuned transformer and said output of said untuned transformer such that said output of said tuned transformer and said output of said untuned transformer are connected to be opposite in phase at frequencies on a side of a resonant frequency of said tuned transformer at which an image frequency is present and in phase at frequencies on a side thereof at which an image signal frequency is absent, whereby output current amplitude levels of both said tuned transformer and said untuned transformer are adjusted to be appropriately equal at an image signal frequency corresponding to a particular receiving frequency.

5. An RF tuning circuit of claim 4 wherein the primary of the untuned transformer is formed by providing a tap on the secondary.

6. An RF tuning circuit of claim 2 wherein the windings of the mutually connected tuned transformer and untuned transformer are wound separately in two slots provided in a three-collared inner core.

7. An RF tuning circuit of claim 3 wherein the windings of the mutually connected tuned transformer and untuned transformer are wound separately in two slots provided in a three-collared inner core.

8. An RF tuning circuit of claim 4, wherein the windings of the mutually connected tuned transformer and untuned transformer are wound separately in two slots provided in a three-collared inner core.

9. An RF tuning circuit of claim 5 where in the windings of the mutually connected tuned transformer and untuned transformer are wound separately in two slots provided in a three-collared inner core.

* * * * *